United States Patent
Huang et al.

(10) Patent No.: US 8,319,245 B2
(45) Date of Patent: Nov. 27, 2012

(54) LEAD FRAME, AND LIGHT EMITTING DIODE MODULE HAVING THE SAME

(75) Inventors: Shih-Chung Huang, Taipei (TW); Chen-Hsiu Lin, Taipei (TW); Meng-Sung Chou, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 355 days.

(21) Appl. No.: 12/457,563

(22) Filed: Jun. 16, 2009

(65) Prior Publication Data

US 2010/0072507 A1  Mar. 25, 2010

(30) Foreign Application Priority Data

Sep. 25, 2008  (CN) .......................... 2008 1 0198897

(51) Int. Cl.
*H01L 33/00* (2010.01)
*H01L 31/0203* (2006.01)
*H01L 23/495* (2006.01)
*H01L 23/48* (2006.01)
*H01L 23/52* (2006.01)
*H01L 29/40* (2006.01)

(52) U.S. Cl. .......... 257/99; 257/100; 257/433; 257/666; 257/692; 257/735; 257/E33.066

(58) Field of Classification Search .................... 257/99, 257/100, 433, 434, 676, 680, 692, 735, 666, 257/E23.01, E25.032, E33.066
See application file for complete search history.

(56) References Cited

U.S. PATENT DOCUMENTS

| 4,266,140 A * | 5/1981 | Kaufman ...................... 250/551 |
| 4,616,250 A * | 10/1986 | Folk .............................. 257/674 |
| 4,893,169 A * | 1/1990 | Rusch et al. ..................... 257/92 |
| 5,208,481 A * | 5/1993 | Kurita et al. ................... 257/666 |
| 2006/0001116 A1* | 1/2006 | Auburger et al. ............. 257/433 |
| 2008/0012125 A1* | 1/2008 | Son ................................ 257/724 |
| 2008/0116549 A1* | 5/2008 | Tsukahara .................... 257/676 |
| 2008/0123328 A1* | 5/2008 | Lai et al. ...................... 362/183 |

* cited by examiner

*Primary Examiner* — Teresa M Arroyo
(74) *Attorney, Agent, or Firm* — Rosenberg, Klein & Lee

(57) ABSTRACT

A light emitting diode (LED) module includes a lead frame having a number (N) of conducting arms spaced apart from each other, where N≧3, and at least one LED die mounted on one of any two neighbor conducting arms. Any two neighbor conducting arms are electrically coupled each other.

8 Claims, 6 Drawing Sheets

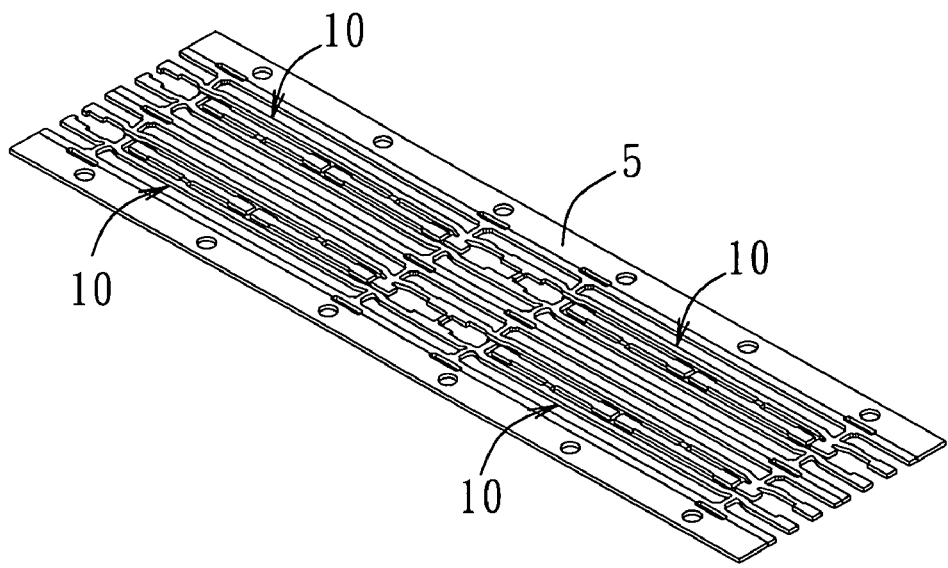
F I G. 4
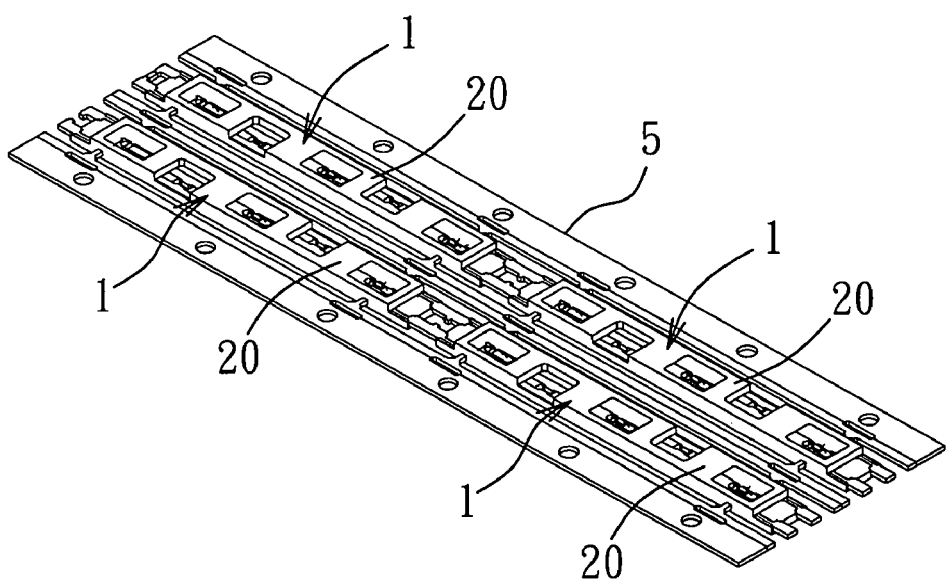
F I G. 5

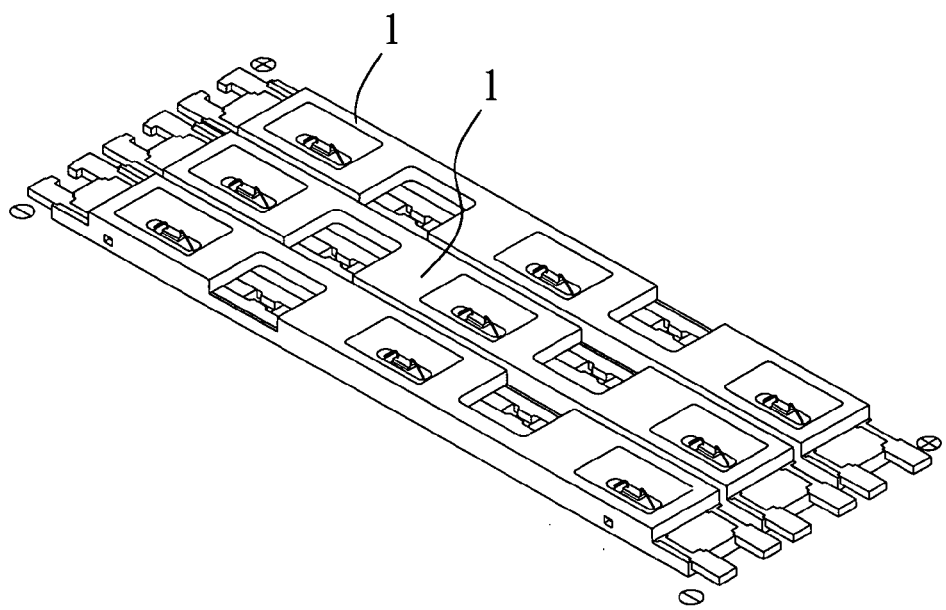
F I G. 7
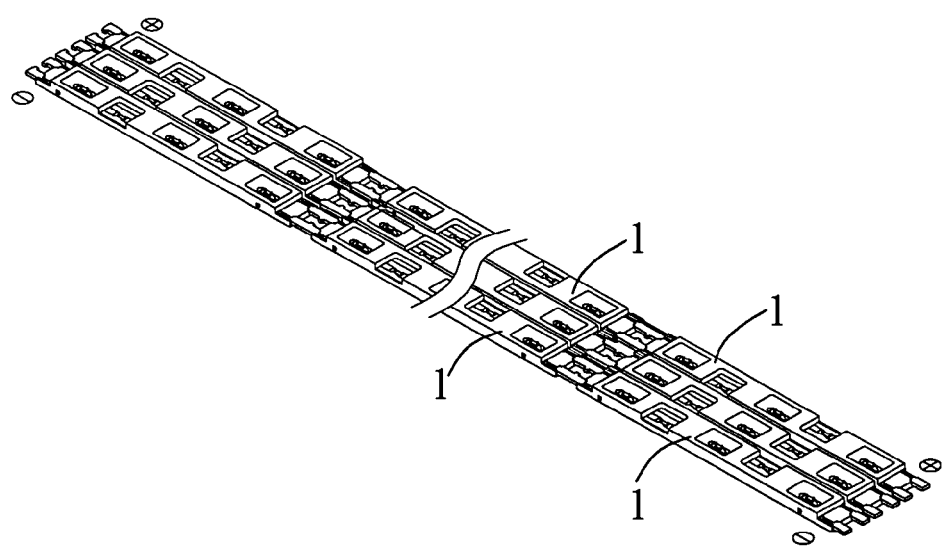
F I G. 8

LEAD FRAME, AND LIGHT EMITTING DIODE MODULE HAVING THE SAME

CROSS-REFERENCE TO RELATED APPLICATION

This application claims priority of Chinese Application No. 200810198897.8, filed on Sep. 25, 2008.

BACKGROUND OF THE INVENTION

1. Field of the Invention

The invention relates to a lead frame for light emitting diode (LED), more particularly to an LED module having a lead frame.

2. Description of the Related Art

A conventional lighting device includes a plurality of LED devices surface-mounted on a circuit board through known surface mounting techniques (SMT). Since the LED devices have a small size, positioning and processing of the LED devices are difficult during mounting of the LED devices. As such, the greater the number of the LED devices, the longer will be processing time. Furthermore, the circuit board has a fixed mounting surface such that the conventional lighting device has a fixed lighting area. As a result, the conventional lighting device cannot conform to requirements for different lighting areas.

SUMMARY OF THE INVENTION

Therefore, an object of the present invention is to provide a light emitting diode module having a lead frame that can be applied to constitute a lighting surface having a desired size and that can easily conform to requirements for different lighting areas.

According to one aspect of the present invention, a light emitting diode (LED) module comprises a lead frame, and at least one LED die.

The lead frame has a number (N) of conducting arms spaced apart from each other, where N≧3.

The at least one LED die is mounted on one of any two neighbor conducting arms.

Any two neighbor conducting arms are electrically coupled each other.

Preferably, each of the LED dies has two conductive contacts, and any two neighbor conducting arms are electrically coupled each other by the two conductive contacts of the LED die.

Preferably, two of the conducting arms have a projection extending toward each other so that the other (N−2) ones of the conducting arms are disposed between the two projections.

BRIEF DESCRIPTION OF THE DRAWINGS

Other features and advantages of the present invention will become apparent in the following detailed description of the preferred embodiments with reference to the accompanying drawings, of which:

FIG. 4 is a perspective view showing an array of the lead frames of the first preferred embodiment;

FIG. 5 is a perspective view showing an array of the LED modules of the first preferred embodiment;

FIGS. 6 to 8 are perspective views illustrating different combinations of the LED modules of the first preferred embodiment.

DETAILED DESCRIPTION OF THE PREFERRED EMBODIMENTS

Figure 1:
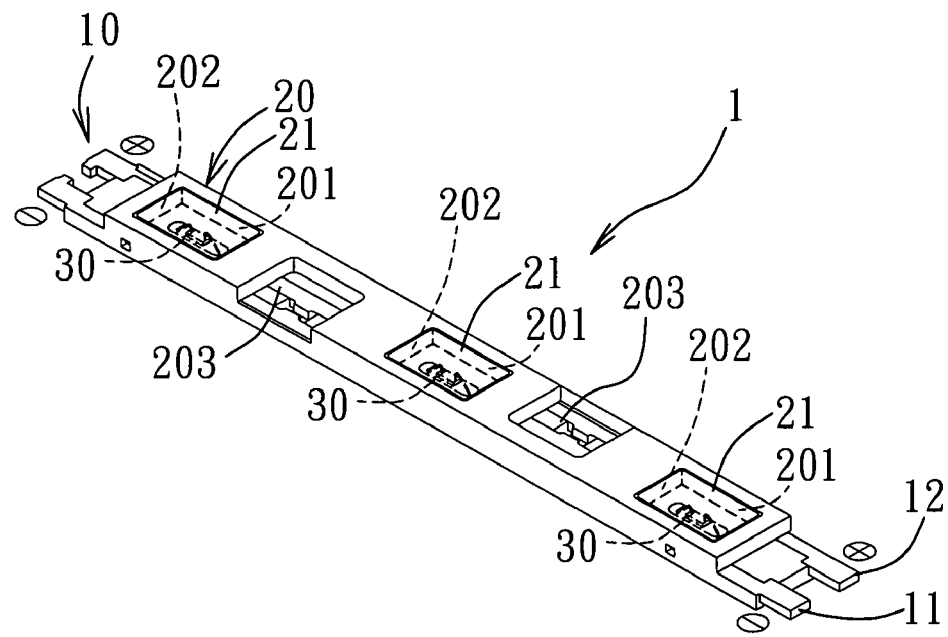
FIG. 1 is a perspective view showing the first preferred embodiment of an LED module according to the present invention.

Before the present invention is described in greater detail, it should be noted that like elements are denoted by the same reference numerals throughout the disclosure.

Figure 2:
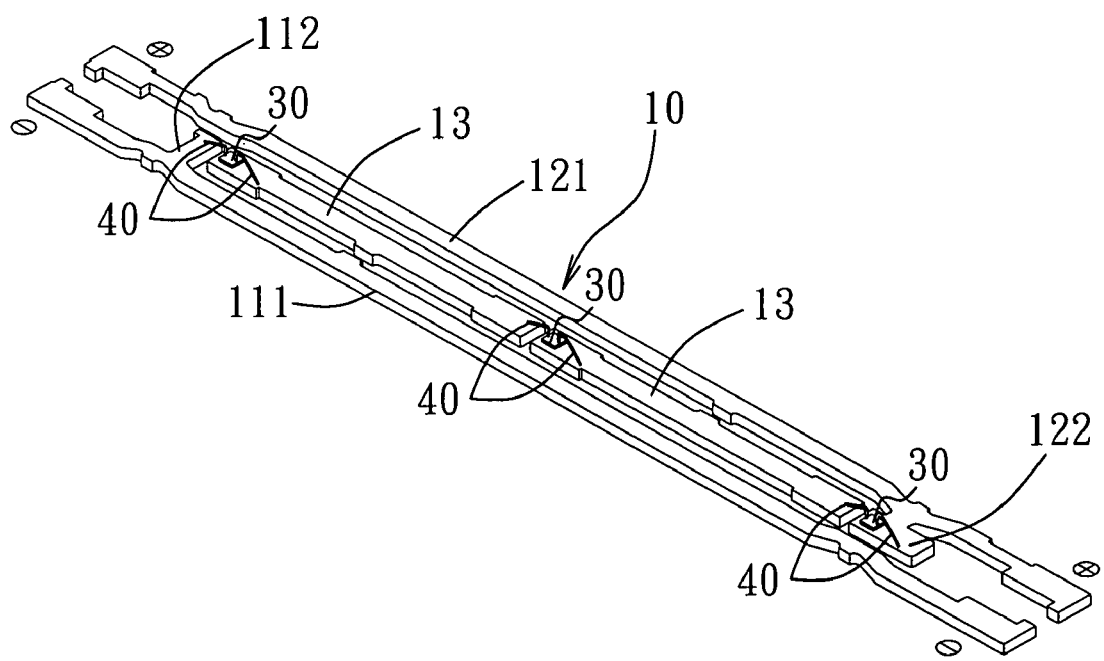
FIG. 2 is a perspective view showing the first preferred embodiment without an insulating casing.
Figure 3:
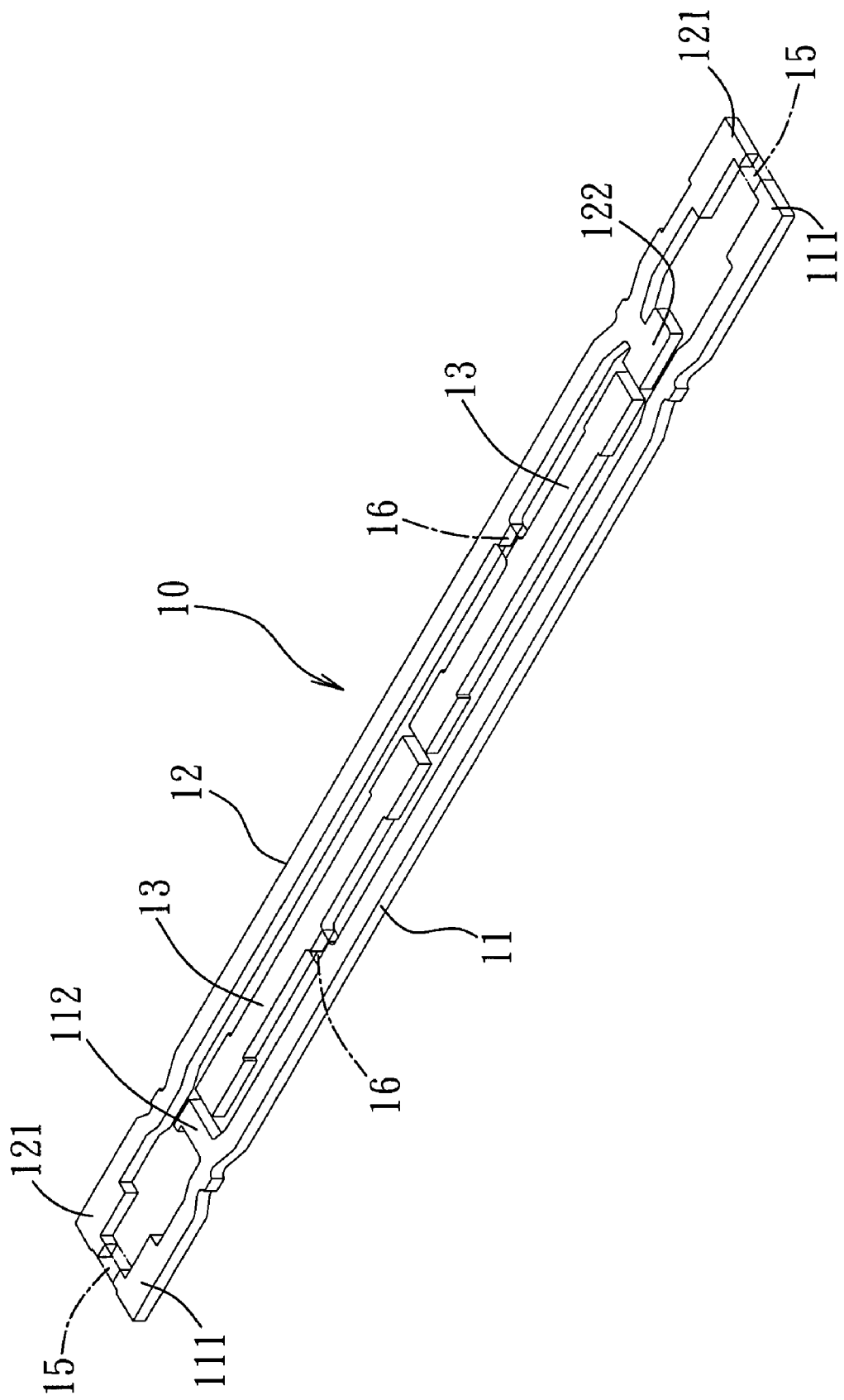
FIG. 3 is a perspective view showing a lead frame of the first preferred embodiment.

Referring to FIGS. 1 to 3, an LED module 1 according to the present invention is shown to include a lead frame 10, at least one LED die 30, and an insulating casing 20.

The lead frame 10 has a number (N) of conducting arms spaced apart from each other, where N≧3. In the first preferred embodiment, the lead frame 10 has a first conducting arm 11, a second conducting arm 12 spaced apart from the first conducting arm 11, and a third conducting arm spaced apart from the first and second conducting arms 11, 12. As shown in FIG. 3, the first and second conducting arms 11, 12 are elongate and parallel, and the third conducting arm is disposed between the first and second conducting arms 11, 12. The third conducting arm further includes two third conducting arm units 13 that are aligned with and spaced apart from each other. In addition, the first, second and third conducting arms 11, 12, 13 are made of a flexible conductive material, such as copper, platinum, aluminum, iron, etc. It is noted that the first conducting arm 11 has opposite ends 111, and a first projection 112 extending toward the second conducting arm 12. The second conducting arm 12 has opposite ends 121, and a second projection 122 extending toward the first conducting arm 11 so that the third conducting arm units 13 are disposed between the first and second projections 112, 122. In other words, two of said conducting arms (such as 11 and 12) have a projection extending toward each other so that the other (N−2) ones of said conducting arms are disposed between said two projections.

As shown in FIG. 2, at least one LED die 30 is mounted on one of any two neighbor conducting arms. That is to say that one of said first and third conducting arms provided with a first area and one of said second and third conductive arms provided with a second area for mounting the LED dice 30. Furthermore, when the third conducting arm has at least two third conducting arm units 13, any two said third conducting arm units 13 is provided with a third area for mounting at least one LED die 30. In this embodiment, one of the LED dice 30 is mounted on the second projection 122 of the second conducting arm 12. Two of the LED dice 30 are mounted respectively on the third conducting arm units 13.

Each LED die 30 has two conductive contacts (not shown), and any two neighbor conducting arms are electrically coupled each other via the two conductive contacts of the LED die (30). Thus, two conductive contacts of the at least one LED die (30) mounted on one of the first and third conducting arms are coupled the first and third conducting arms, and two conductive contacts of the at least one LED die (30) mounted on one of the second and third conducting arms are coupled to said second and third arms. In this embodiment, the conductive contacts of the LED die 30 mounted on the second projection 122 of the second conducting arm 12 are coupled respectively to the second conducting arm 12 and one of the third conducting arm units 13 adjacent to the second conducting arm 12 via known wire bonding techniques by means of two conductive wires 40. Similarly, the conductive contacts of the LED die 30 mounted on said one of the third conducting arm units 13 are coupled respectively to said one of the third conducting arm units 13 and the other third conducting arm unit 13 by means of two conductive wires 40. The conductive contacts of the LED die 30 mounted on the other third conducting arm unit 13 are coupled respectively to the first conducting arm 11 and the other third conducting arm unit 13. As a result, the LED dice 30 are coupled in series in this LED module.

As shown in FIG. 1, the insulating casing 20 is partly covers the lead frame 10 so that the opposite ends 111, 121 of the first and second conducting arms 11, 12 are exposed. The insulating casing 20 is formed with a plurality openings 201 corresponding respectively to the LED dice 30 such that the LED dice 30 are exposed through the openings 201. Each opening 201 is filled with light-transmissive resin 21 for covering a corresponding one of the LED dice 30, wherein the light-transmissive resin 21 with fluorescent powder is preferred. In this embodiment, each opening 201 is defined by an inner surrounding wall 202 surrounding the corresponding one of the LED dice 30. Preferably, each opening 201 gradually converges toward the corresponding one of the LED dice 30, and each inner surrounding wall 202 is formed with a light reflecting layer (not shown), such as a metal layer, a fluorescent layer, a ceramic layer, etc., for light reflection. Furthermore, the insulating casing 20 is further formed with a plurality of auxiliary openings 203, each disposed between two adjacent ones of the openings 201. Due to the presence of the auxiliary openings 203, flexibility of the LED module 1 can be ensured. In addition, the insulating casing 20 is made of plastic, ceramics, BN, AlN or SiCAl.

In this embodiment, the lead frame 10 can be formed by pressing a material piece. It is noted that, in this stage, the first and second conducting arms 11, 12 are connected each other through first connecting sections 15, and the third conducting arm units 13 are connected respectively to the first and second conducting arms 11, 12 through second connecting sections 16, as shown in FIG. 3. Thereafter, subsequent process, such as molding and die mounting are performed, wherein the first and second connecting sections 15, 16 can be removed after any process of molding. Finally, package is performed to obtain the LED module 1 shown in FIG. 1.

Referring to FIG. 4, an array (2×2) of the lead frames 10 can be formed by pressing a material piece 5. It is noted that, in this stage, the lead frames 10 are connected to each other, and the first, second and third conducting arms of each lead frame 10 are connected to each other. Then, an array (2×2) of the LED modules 1 can be produced using the array of the lead frames 10 of FIG. 4, as shown in FIG. 5. In this case, the LED modules 1 are still connected to each other. Finally, the array of the LED modules 1 is divided to obtain separate LED modules 1.

Figure 6:
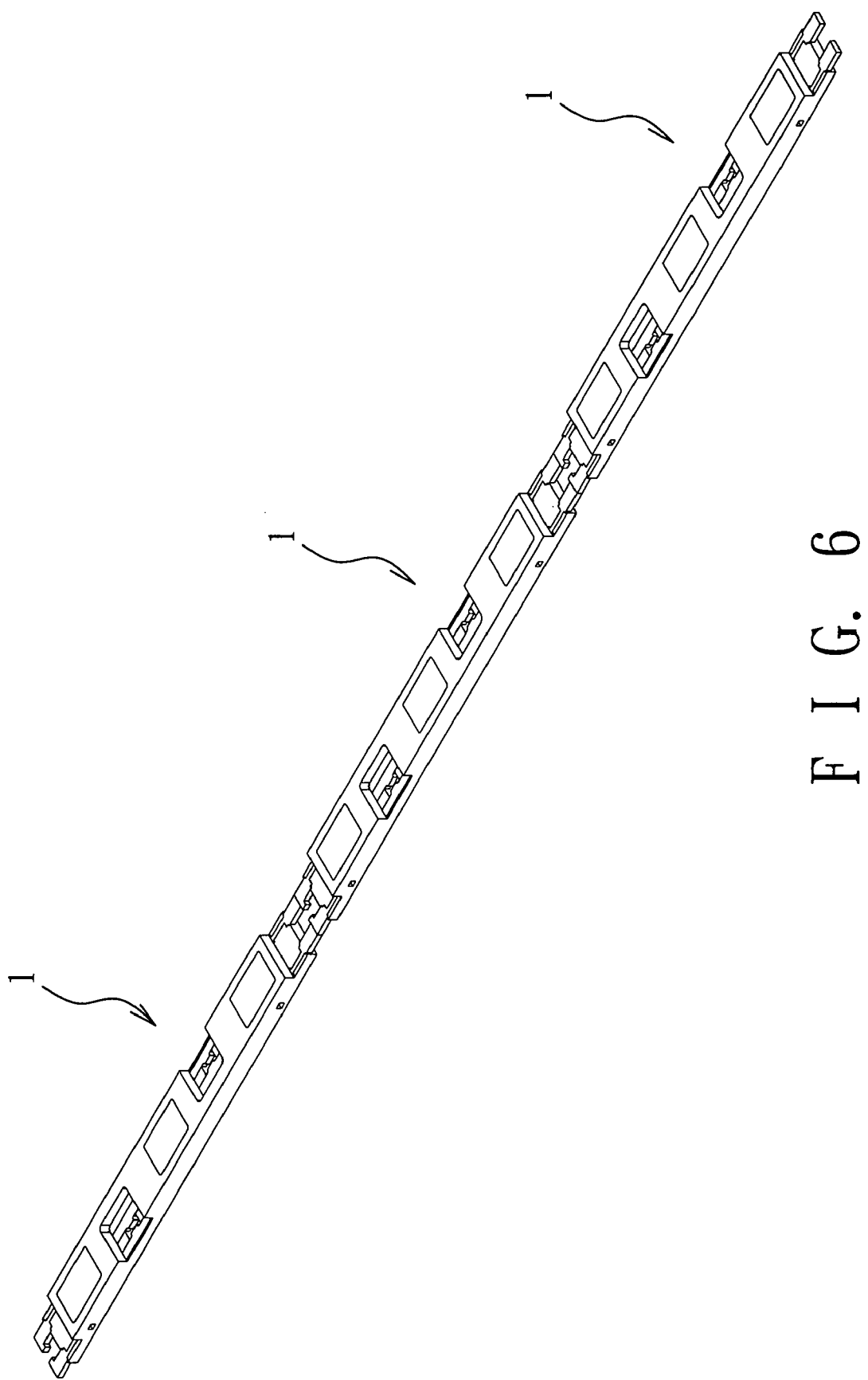

FIGS. 6 to 8 illustrate different combinations of the LED modules 1, wherein any two neighbor LED modules are coupled electrically in parallel. Therefore, the LED module 1 of the present invention can be applied to constitute a lighting surface having a desired size. Furthermore, as compared to a conventional LED module wherein LED device are directly soldered on a circuit board to decide a light area, the present invention can easily provide a set of the LED modules 1 having a desired lighting area.

Figure 9:
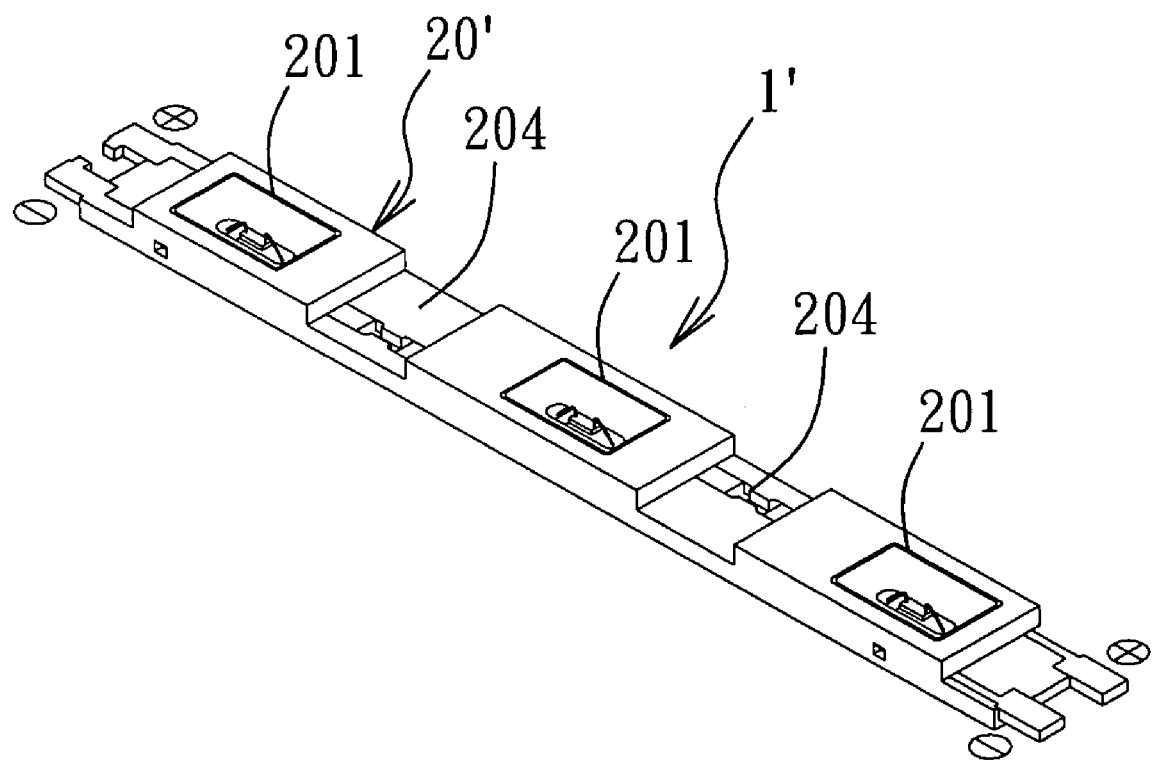
FIG. 9 is a perspective view showing the second preferred embodiment of an LED module according to the present invention.

FIG. 9 illustrates the second preferred embodiment of an LED module 1' according to this invention, which is a modification of the first preferred embodiment. In this embodiment, the insulating casing 20' is formed with a plurality of recesses 204 disposed between two adjacent ones of the openings 201 for ensuring flexibility of the LED module 1'.

However, in other embodiments, when the third conducting arm has one third conducting arm unit and the number of the LED dice is at least equal to 2, one LED die is mounted on one of the first and second conducting arms, and the other LED die is mounted on the third conducting arm. Alternatively, when the third conducting arm unit includes three third conducting arms and the number of the LED dice is at least equal to 4, one LED die is mounted on one of the first and second conducting arms, and the other three LED dice are mounted respectively on the third conducting arms. In short, preferably, the number of the LED dice is at least equal to the number of the third conducting arms plus one. Therefore, when the number of the third conducting arms is increased, the number of the LED dice connected in series can be increased.

In sum, the present invention can provide the LED module 1 formed by mounting the LED dice 30 on the lead frame 10. Then, a desired lighting area can be obtained by arranging a set of the LED modules 1. Furthermore, since the number of the LED dice 30 is directly mounted on the lead frame 10, difficulty in positioning and processing of the LED device during mounting encountered in the prior art can be avoided and the processing time can be shorten.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A light emitting diode (LED) module comprising:
   a lead frame including
      a first conducting arm,
      a second conducting arm spaced apart from said first conducting arm, and
      a third conducting arm spaced apart from said first and second conducting arms; wherein said first conducting arm, said second conducting arm and said third conducting arm are spaced apart from each other for providing electric insulation thereamong;
   at least one first LED die mounted on one of said first and third conducting arms; and
   at least one second LED die mounted on one of said second and third conducting arms;
   wherein each of said first and second LED dice has two conductive contacts, and said two conductive contacts of said first LED die are coupled to said first and third conducting arms, said two conductive contacts of said second LED die being coupled to said second and third arms.

2. The LED module as claimed in claim 1, wherein said first conducting arm has a first projection extending toward said second conducting arm, and said second conducting arm has a second projection extending toward said first conducting arm so that said third conducting arm is disposed between said first and second projections.

3. The LED module as claimed in claim 1, wherein said third conducting arm comprises at least two third conducting arm units, at least one third LED die being mounted on one of any two said third conducting arms units.

4. The LED module as claimed in claim 3, wherein said first conducting arm has a first projection extending toward said second conducting arm, and said second conducting arm has a second projection extending toward said first conducting arm so that said third conducting arm units are disposed between said first and second projections.

5. The LED module as claimed in claim 4, further comprising an insulating casing for partly covering said lead frame so that opposite ends of each of said first and second conducting arms are exposed.

6. The LED module as claimed in claim 5, wherein said insulating casing is formed with a plurality of openings corresponding respectively to said LED dice such that said LED dice are exposed through said openings.

7. The LED module as claimed in claim 6, further comprising light-transmissive resin filled in said openings in said insulating casing.

8. The LED module as claimed in claim 7, wherein each of said openings in said insulating casing is defined by an inner surrounding light reflecting wall.

* * * * *